(12) United States Patent
Shukh

(10) Patent No.: US 9,129,692 B1
(45) Date of Patent: Sep. 8, 2015

(54) HIGH DENSITY MAGNETIC RANDOM ACCESS MEMORY

(71) Applicant: Alexander Mikhailovich Shukh, San Jose, CA (US)

(72) Inventor: Alexander Mikhailovich Shukh, San Jose, CA (US)

( * ) Notice: Subject to any disclaimer, the term of this patent is extended or adjusted under 35 U.S.C. 154(b) by 0 days.

(21) Appl. No.: 14/708,272

(22) Filed: May 10, 2015

Related U.S. Application Data

(63) Continuation of application No. 13/441,841, filed on Apr. 7, 2012, now Pat. No. 9,070,456.

(51) Int. Cl.
*G11C 11/00* (2006.01)
*G11C 11/16* (2006.01)

(52) U.S. Cl.
CPC .......... *G11C 11/161* (2013.01); *G11C 11/1675* (2013.01)

(58) Field of Classification Search
CPC ........................................................ G11C 11/00
USPC .......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 5,640,343 A | 6/1997 | Gallagher et al. | |
| 6,211,090 B1 | 4/2001 | Durlam et al. | |
| 6,256,223 B1 | 7/2001 | Sun | |
| 6,269,018 B1 | 7/2001 | Monsma et al. | |
| 6,363,000 B2 | 3/2002 | Perner et al. | |
| 6,801,451 B2 | 10/2004 | Tran et al. | |
| 6,950,333 B2 | 9/2005 | Hiramoto et al. | |
| 7,006,375 B2 | 2/2006 | Covington | |
| 7,224,601 B2 | 5/2007 | Panchula | |
| 7,313,013 B2 | 12/2007 | Sun et al. | |
| 7,411,817 B2 | 8/2008 | Nozieres et al. | |
| 7,432,574 B2 | 10/2008 | Nakamura et al. | |
| 7,508,042 B2 | 3/2009 | Guo | |
| 7,511,991 B2 | 3/2009 | Saito et al. | |
| 7,532,505 B1 | 5/2009 | Ding | |
| 7,596,015 B2 * | 9/2009 | Kitagawa et al. ............. | 365/158 |
| 7,869,265 B2 | 1/2011 | Shimizu et al. | |
| 7,924,607 B2 | 4/2011 | Yoshikawa et al. | |

(Continued)

OTHER PUBLICATIONS

X. Zhu and J.-G. Zhu, IEEE Trans.Magn., v.42, p. 2739-2741 (2006).

(Continued)

*Primary Examiner* — Harry W Byrne

(57) ABSTRACT

A method for writing to a magnetic memory comprising: providing a plurality of magnetic tunnel junctions arranged into columns and rows, applying a first current to a first conductive line coupled to a row of magnetic tunnel junctions at their ends adjacent to a free ferromagnetic layer to produce a bias magnetic field; and applying a second current to a second conductive line electrically coupled to a column of magnetic tunnel junctions at their ends adjacent to a pinned ferromagnetic layer to produce a spin momentum transfer in the free ferromagnetic layer of a first magnetic tunnel junction disposed at a first intersection region formed by the first conductive line and the second conductive line; wherein a joint effect of the first and second currents applied simultaneously reverses a magnetization direction of the free ferromagnetic layer of the first magnetic tunnel junction. Other embodiments of the magnetic memory are disclosed.

10 Claims, 9 Drawing Sheets

(56) References Cited

U.S. PATENT DOCUMENTS

| | | | |
|---|---|---|---|
| 8,098,514 B2 * | 1/2012 | Nagase et al. | 365/158 |
| 8,107,281 B2 * | 1/2012 | Kai et al. | 365/158 |
| 8,208,292 B2 * | 6/2012 | Kai et al. | 365/158 |
| 2009/0080239 A1 | 3/2009 | Nagase et al. | |
| 2009/0103354 A1 | 4/2009 | Yoon et al. | |
| 2009/0251951 A1 * | 10/2009 | Yoshikawa et al. | 365/158 |
| 2011/0073970 A1 | 3/2011 | Kai et al. | |

OTHER PUBLICATIONS

S. Mangin et al., Applied Physics Letters, v.94, 012502 (2009).

US 7,529,121, 05/2009, Kitagawa et al. (withdrawn)

* cited by examiner

HIGH DENSITY MAGNETIC RANDOM ACCESS MEMORY

CROSS-REFERENCE TO RELATED APPLICATIONS

This application is a continuation of U.S. patent application Ser. No. 13/441,841, filed on Apr. 7, 2012, which claims priority to U.S. provisional patent application No. 61/472,788, filed on Apr. 7, 2011, the disclosure of which is incorporated herein by reference, as though set forth in full.

FEDERALLY SPONSORED RESEARCH

Not Applicable

SEQUENCE LISTING OR PROGRAM

Not Applicable

RELEVANT PRIOR ART

U.S. Pat. No. 5,640,343, Jun. 17, 1997—Gallagher et al.
U.S. Pat. No. 7,224,601, May 29, 2007—Panchula
U.S. Pat. No. 7,529,121, May 5, 2009—Kitagawa et al.

BACKGROUND

Magnetic random access memory (MRAM) using spin-induced switching is a strong candidate for providing a dense and fast non-volatile storage solution for future memory applications. Each MRAM includes an array of memory cells. FIG. 1 shows a schematic view of MRAM cell employing a spin-induced writing mechanism according to a prior art. The cell comprises a magnetoresistive element (or magnetic tunnel junction) J, a selection transistor T, a bit line BL, a word line WL, and a source line SL. The bit and word lines are formed in different layers and intersect each other in space. The magnetoresistive (MR) element J and the selection transistor T are connected in series and disposed in a vertical space between intersecting bit and word lines. They are connected to the source line SL at one end and to the bit line BL at another end. The word line is connected to a gate terminal of the selection transistor T. The MR element J comprises at least a pinned (or reference) layer 12 with a fixed direction of magnetization (shown by a solid arrow), a free (or storage) layer 16 with a reversible magnetization direction (shown by a dashed arrow), and a tunnel barrier layer 14 disposed between the pinned and free magnetic layers. The direction of the magnetization in the free layer 16 can be controlled by a direction of a spin-polarized current $I_S$ running through the element J in a direction perpendicular to a film surface. Resistance of the MR element depends on a mutual orientation of the magnetizations in the magnetic layers 12 and 16. The resistance is low when the magnetizations in the layers 12 and 16 are parallel to each other (logic "0"), and high when the magnetizations are antiparallel (logic "1"). Difference in the resistance between two magnetic states can exceed several hundred percent at room temperature.

FIG. 2 shows a circuit diagram of a portion of MRAM 20 with spin-induced switching according to a prior art. The MRAM 20 includes an array 22 of memory cells C11-C33 (other cells are not shown) disposed in a vertical space between pluralities of parallel bits and word lines at their intersections. Each memory cell comprises an MR element J and transistor T connected in series. A plurality of parallel bit lines BL1-BL3 is connected to a bit line driver 24. A plurality of the word lines WL1-WL3 is connected to a word line driver 26. A plurality of the parallel source lines SL1-SL3 is connected to a source line driver 28. Selection of a memory cell in the array 22 is provided by applying a suitable signal to appropriate bit and word lines. For instance, to select the memory cell C22 that is located at the intersection of the bit line BL2 and the word line WL2, the signals need to be applied to these lines through the drivers 24 and 26, respectively.

Cell size is one of key parameters of the MRAM. It substantially depends on the size and number of selection transistors supplying a spin-polarized write current to a MR element. The number of the transistors controlling the write current usually vary from one to two per a MR element. It depends on a saturation current of a selection transistor and magnitude of the spin-polarized current required to cause switching of the MR element. Frequently, especially for MR elements having in-plane magnetization in magnetic layers, one selection transistor cannot provide the required spin-polarized current due to its saturation. This obstacle prevents the MRAM cell size reduction.

Another important parameter of MRAM is a write speed. The write speed depends on a magnitude of the spin-polarized current running through the MR element. High speed (short duration of the write current pulse) requires higher magnitude of the spin-polarized current that can be limited by the saturation current of the selection transistor or by a breakdown of the tunnel barrier layer.

The present disclosure addresses to the above problems.

SUMMARY

Disclosed herein is a magnetic memory device that comprises a substrate, a memory cell including a magnetic tunnel junction which comprises a free ferromagnetic layer having a reversible magnetization direction directed substantially perpendicular to the substrate in an equilibrium state, a pinned ferromagnetic layer having a fixed magnetization direction, and an insulating tunnel barrier layer disposed between the pinned ferromagnetic layer and the free ferromagnetic layer, a first electrical circuit for applying a first current to a first conductor comprising ferromagnetic cladding to produce a bias magnetic field applied along a hard magnetic axis of the free ferromagnetic layer, the first conductor is electrically coupled to the free ferromagnetic layer, a second electrical circuit for applying a second current to a second conductor to cause a spin momentum transfer in the free ferromagnetic layer, the second conductor is electrically coupled to the pinned ferromagnetic layer, wherein a magnitude of the bias magnetic field and a magnitude of the spin momentum transfer in combination exceed a threshold and thus reverse the magnetization direction of the free ferromagnetic layer when the first write current and the second write current are applied to the memory cell at the same time.

Also disclosed a magnetic memory device that comprises a substrate, a first plurality of electrically conductive lines formed on the substrate, a second plurality of electrically conductive lines formed on the substrate and overlapping the first plurality of lines at a plurality of intersection regions, a plurality of memory cells formed on the substrate and arranged in an array, each memory cell being located at an intersection region and comprising a magnetic tunnel junction which includes a free ferromagnetic layer having a reversible magnetization direction directed substantially perpendicular to the substrate in an equilibrium state, a pinned ferromagnetic layer having a fixed magnetization direction, and an insulating tunnel layer disposed between the pinned ferromagnetic layer and the free ferromagnetic layer, each magnetic tunnel junction is electrically coupled to one of the first plurality of lines at the free ferromagnetic layer and to one of the second plurality of lines at the pinned ferromagnetic layer, wherein the magnetization direction of the free ferromagnetic layer is reversed by a spin-polarized current flowing through the magnetic tunnel junction in a direction perpendicular to the substrate.

Also disclosed a method for writing to a magnetic memory device that includes a plurality of magnetic tunnel junctions formed on a substrate and arranged in columns and rows, each magnetic tunnel junction comprising a free ferromagnetic layer having a reversible magnetization direction directed substantially perpendicular to the substrate in an equilibrium state, a pinned ferromagnetic layer having a fixed magnetization direction, and an insulating tunnel barrier layer disposed between the free ferromagnetic layer and the pinned ferromagnetic layer, the method includes applying a bias current to a bit conductive line comprising ferromagnetic cladding and being electrically coupled to a row of magnetic tunnel junctions at the free ferromagnetic layer to produce a bias magnetic field along a hard magnetic axis of the free ferromagnetic layer, applying a first current to a conductive word line electrically coupled to a column of magnetic tunnel junctions at the pinned ferromagnetic layer to produce a spin momentum transfer in the free ferromagnetic layer of a magnetic tunnel junction located at a first intersection region of the bit conductive line and the word conductive line, wherein the bias current and the first current are applied at the same time, and a joint effect of the bias magnetic field and the spin momentum transfer causes a reversal of the magnetization direction of the free ferromagnetic layer of the magnetic tunnel junction located at the first intersection region.

Figure 1:
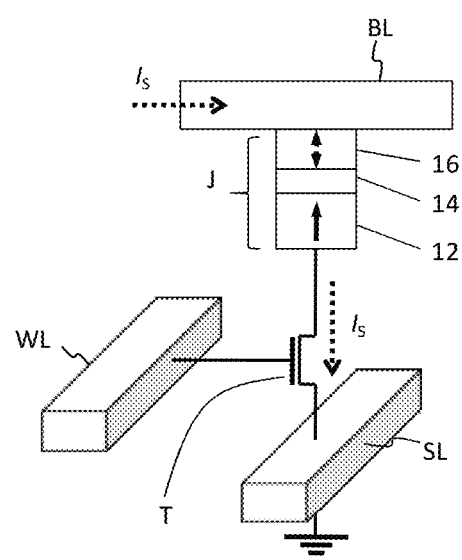
FIG. 1 is a schematic view of a memory cell with spin-induced switching according to a prior art.
Figure 2:
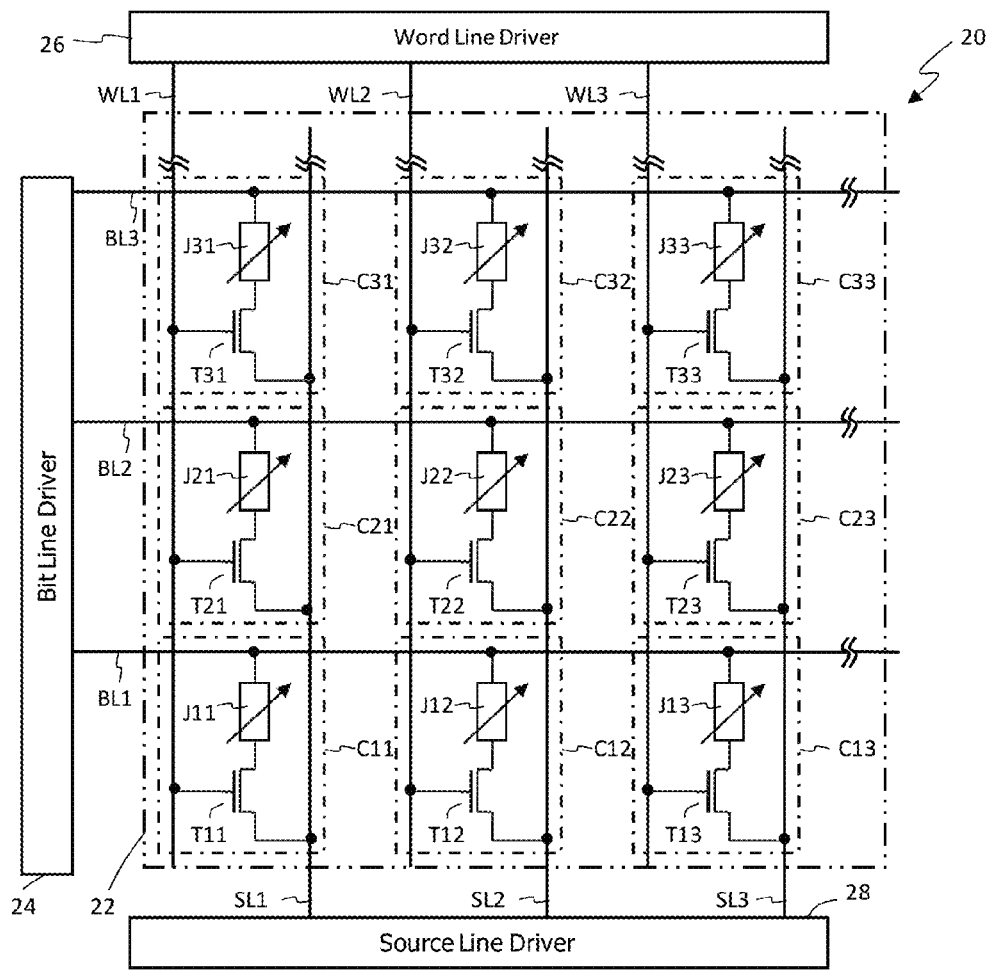
FIG. 2 is a circuit diagram of a magnetic random access memory with spin-induced switching according to a prior art.

EXPLANATION OF REFERENCE NUMERALS 12 pinned (or reference) magnetic layer
14 tunnel barrier layer
16 free (or storage) magnetic layer
20, 30, 60 magnetic random access memory (MRAM)
22 array of memory cells
24 bit line driver
26 word line driver
28 source line driver
52 conductor
54 magnetic flux concentrator
56 non-magnetic gap
BL, BL1, BL2, BL3 bit line
C11-C33 memory cell
J, J11-J33 magnetic tunnel junction
SA1-SA3 sense amplifier
SL, SL1, SL2, SL3 source line
T, T11-T33 selection transistor
Tb1-Tb6 bit line transistor
Ts1-Ts3 read transistor
Tw1-Tw6 word line transistor
WL, WL1, WL2, WL3 word line

DETAILED DESCRIPTION

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses an device or method for embodying the technical idea of the present disclosure. Therefore, the technical idea of the present disclosure does not limit the materials, structures, arrangements, and the like of constituent parts to those described below. The technical idea of the present disclosure can be variously changed within the scope of the appended claims.

Figure 4:
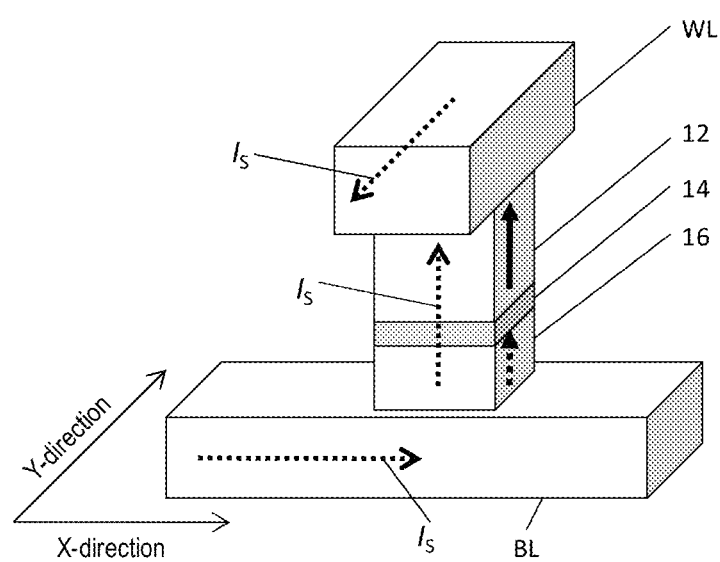
FIG. 4 is a schematic view of a memory cell with a spin-induced switching according to an embodiment of the present disclosure.
Figure 5:
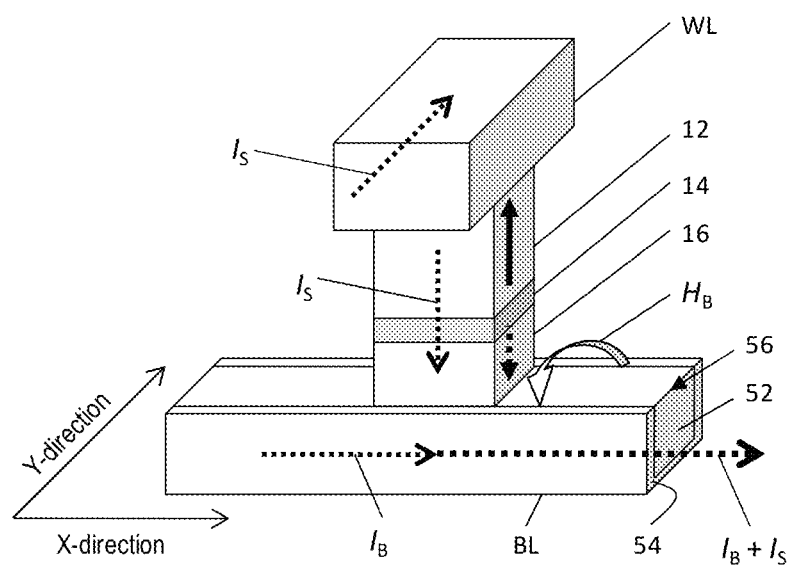
FIG. 5 is a schematic view of a memory cell with a hybrid switching mechanism.

Refer now to the drawings, FIG. 1, FIG. 4, and FIG. 5 illustrate exemplary aspects of MR element. Specifically, these figures illustrate the MR element having a multilayer structure with a perpendicular direction of magnetization in magnetic layers. The direction (or orientation) of the magnetization in the magnetic layers are shown by solid or dashed arrows. The magnetization in the magnetic layer can be directed perpendicular or in-plane to surface of the magnetic layers. The MR element can store binary data by using steady logic states determined by mutual orientation of the magnetizations in the magnetic layers separated by a tunnel barrier layer. The logic state "0" or "1" of the MR element can be changed by a spin-polarized current running through the element in the direction across the tunnel barrier layer or perpendicular to a film surface.

The MR element herein mentioned in this specification and in the scope of claims is a general term of a tunneling magnetoresistance (TMR) element using an insulator or semiconductor as the tunnel barrier layer. Although the above mentioned figures each illustrate the major components of the MR element, another layer (or layers) such as a seed layer, a pinning layer a cap layers, and others may also be included.

Figure 3A:
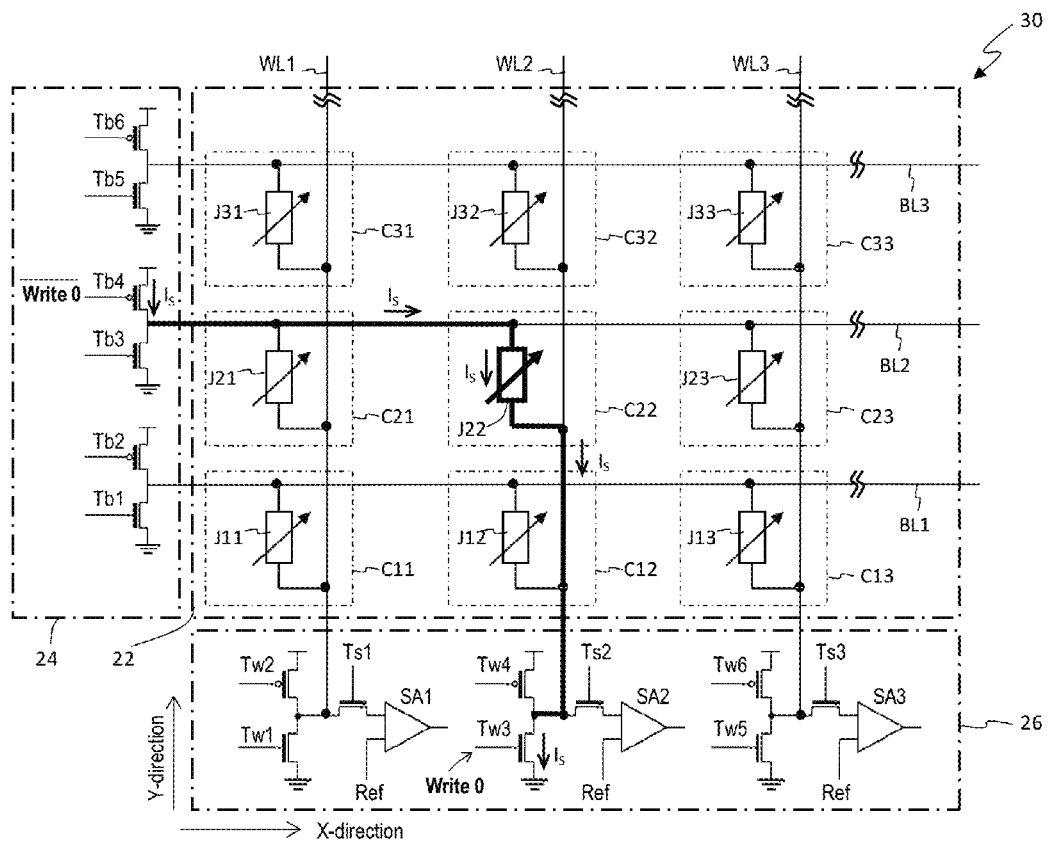
FIGS. 3A and 3B is a circuit diagram of magnetic random access memory with a spin-induced switching according to an embodiment of the present disclosure illustrating writing of logic "0" and logic "1" to a memory cell.
Figure 3B:
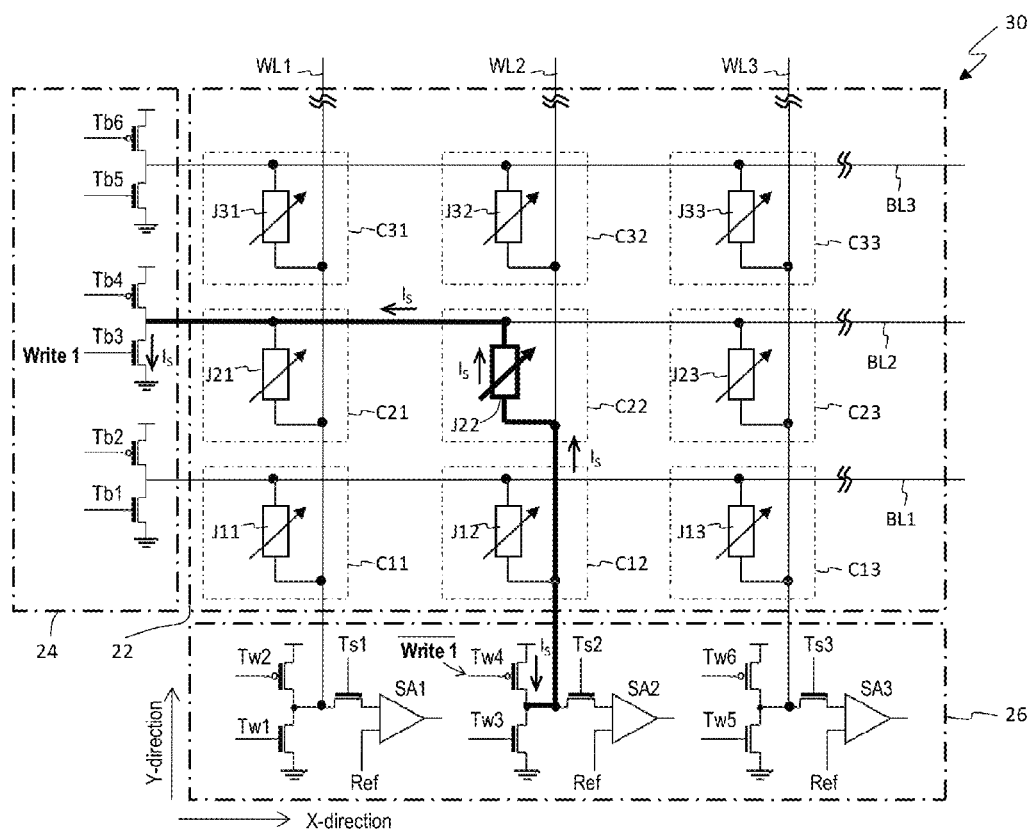

FIGS. 3A and 3B show a circuit diagram of a portion of MRAM 30 according to an embodiment of the present disclosure. The memory includes an array 22 of memory cells C11-C33, a plurality of parallel bit lines BL1-BL3 connected at their end to a bit line driver 24, and a plurality of parallel word lines WL1-WL3 connected at their end to word line driver 26.

Each memory cell comprises an MR element without a selection transistor. The MR element is connected to the appropriate bit and word lines at its ends and disposed at the intersection of the lines in a vertical space between them. Schematic view of the memory cell of the MRAM 30 is shown on FIG. 4. The MR element J comprises at least a pinned magnetic layer 12 having a fixed magnetization direction (shown by a solid arrow), a free magnetic layer 16 having a variable (or reversible) magnetization direction (shown by a dashed arrow), and a tunnel barrier layer 14 disposed between the pinned and free magnetic layers. The free magnetic layer 16 can be made of a magnetic material with a substantial spin-polarization and has a the magnetization directed substantially perpendicular to a layer surface in its equilibrium state. For example, the free magnetic layer 16 can be made of $(Co_{30}Fe_{70})_{85}B_{15}$ (% atomic) alloy having a thickness of about 1.5 nm. The pinned magnetic layer 12 can be made of a magnetic material with a substantial spin-polarization and has the magnetization directed substantially perpendicular to a layer surface. For example, the pinned magnetic layer can be made of the $(Co_{30}Fe_{70})_{85}B_{15}$ (% atomic) alloy having a thickness of about 2.5 nm. The tunnel barrier layer 14 can be made of MgO having a thickness of about 1.1 nm. The free, tunnel barrier and pinned layers form a substantially coherent texture having a BCC (body-centered cubic) structure with (001) plane orientation. The MR element with this crystalline structure provides a substantial tunneling magnetoresistance (TMR≥100% at room temperature) and a density of spin-polarized write current of about $1 \cdot 10^6$ A/cm$^2$ or less. These parameters are essential for MRAM.

In the MRAM 30 shown in FIGS. 3A and 3B the pluralities of the conductive bit and the word lines intersect each other but spaced from each other in direction perpendicular to a plane of substrate (not shown). Each of the memory cells C11-C33 comprises an appropriate MR element J11-J33 that is disposed at an intersection of a bit and word line in the vertical space between them. The MR element is electrically connected to the intersecting bit and the word lines by its opposite ends. For instance the memory cell C22 comprises the MR element J22 disposed at the intersection of the bit line BL2 and the word line WL2. The MR element J22 is electrically connected to the word line WL2 at its first end and to the bit line BL2 at its second end.

The bit lines BL1-BL3 extend in an X-direction. They are electrically connected at one end to a bit line driver 24 that includes CMOS transistors Tb1-Tb6. For example, the bit line BL2 is connected by one end to a common drain terminal formed by a n-type transistor Tb3 and p-type transistor Tb4. A source terminal of the p-type transistor Tb4 is connected to a power supply. A source terminal of the n-type transistor Tb3 is connected to a ground. Similarly the bit lines BL1 and BL3 are connected to the pairs of CMOS transistors Tb1, Tb2 and Tb5, Tb6, respectively. Gate terminals of the transistors Tb1-Tb6 are connected to the bit line driver 24. The bit line driver 24 operates as a row selection switch.

The word line WL1-WL3 extend in an Y-direction crossing the X-direction. One end of the word line WL1-WL3 is connected to the word line driver 26. The driver 26 comprises a plurality of read/write circuits. Each of the read/write circuits includes at least a pair of CMOS transistors comprising one of p-type transistors Tw2, Tw4 or Tw6 and one of n-type transistors Tw1, Tw3 or Tw5 connected in series to each other, and a sense amplifier SA1-SA3. Each of the transistors pairs Tw1 and Tw2, Tw3 and Tw4, Tw5 and Tw6 is connected to a power supply at a source terminal of the appropriate p-type transistor and to the ground at a source terminal of the appropriate n-type transistor. The word line is connected to a common drain terminal of the CMOS transistor pair and to one input terminal of the sense amplifier SA through a read transistor Ts. For example, the word line WL2 is connected by its end to the common drain terminal formed by the transistor Tw3 and Tw4 and to the first input terminal of the sense amplifier SA2 through the read transistor Ts2. Second input terminal of the sense amplifier SA2 is connected to a reference element (not shown). Gates of the transistors Tw1-Tw6 are connected to the word line driver 26. The driver 26 operates as a column selection switch.

The sense amplifier SA1-SA3 comprises at least two inputs. One input of the amplifier is connected to the end of the word line WL1-WL3 and to the common drain terminal of the transistor pair by mean of the read transistor Ts1-Ts3. The other input of the sense amplifier is connected to a reference element (not shown). The sense amplifier judges a data value of the MR element inside of the selected memory cell based on a reference signal Ref.

The memory 30 shown in FIGS. 3A and 3B comprises the array 22 of the MR elements J11-J33 disposed above the silicon wafer (not shown). The selection transistors Tb1-Tb6 and Tw1-Tw6 may be positioned along a perimeter of the array 22. The wafer area located underneath of the memory array is not occupied by the selection transistors and can be used for another circuits. Hence the present design can provide a substantial reduction of a chip/die size. Moreover, the peripheral location of the selections transistors provides a possibility of using large selection transistors or several transistors providing a substantial write current that is essential for high speed writing.

The MRAM 30 shown in FIGS. 3A and 3B employs a spin-induced switching mechanism of the MR elements. According to spin-induced switching the orientation of magnetization in the free layer 16 can be reversed by a spin-polarized current $I_S$ running through the MR element (FIG. 4). Electrons of the write current have a substantial degree of spin polarization that is predetermined by magnetic properties of the pinned layer 12. The spin-polarized electrons running through the free layer 16 transfer a moment of their spins causing the magnetization in the free layer to change its direction. Polarity of the magnetization in the free layer 16 can be controlled by a direction of the spin-polarized current $I_S$ running through the MR element. The direction of the spin-polarized current in the MR element shown on FIG. 4 corresponds to writing a logic "0" or to parallel orientation of magnetizations in the free 16 and pinned 12 magnetic layers.

FIG. 3A shows writing of a logic "0" to the MR element J22 of the memory cell C22. A switching current $I_S$ is produced in the MR element by applying appropriate input signals to the gate of the transistor Tb4 (Write0) and to the gate of the transistor Tw3 (Write 0). Both transistors are partially opened. The spin-polarized current $I_S$ is running from the power supply through the transistor Tb4, bit line BL2, MR element J22, word line WL2, and transistor Tw3 to the ground. The appropriate bit and word lines, and MR element are shown in bold. For the MR element having a configuration shown in FIG. 4 the current $I_S$ is running from the free layer 16 to the pinned layer 12 through the tunnel barrier layer 14. The spin-polarized conductance electrons are moving in opposite direction from the pinned layer 12 to the free layer 16. For the giving direction of the current $I_S$ the magnetization in the free layer 16 will be directed in parallel to the magnetization direction of the pinned layer 12. This mutual orientation of the magnetizations corresponds to a low resistance state of the MR element or to a logic "0".

FIG. 3B illustrates writing logic "1" to the MR elements J22. The write current $I_S$ is supplied to the MR element J22 by simultaneously applying an appropriate input signal to the gate of the transistors Tb3 (Write 1) and Tw4 (Write1). The transistors are partially opened and the current $I_S$ is running from the transistor Tw4 to the transistor Tb3 through the word line WL2, MR element J22, and bit line BL2 (shown in bold).

In the MR element J22 having a configuration shown in FIG. 4 the spin-polarized current $I_S$ is running from the pinned layer 12 to the free layer 16. This direction of the spin-polarized current will orient the magnetization in the free layer 16 anti parallel to the magnetization direction of the pinned layer 12. This mutual orientation of the magnetizations corresponds to a high resistance state or to a logic "1".

According to theory, the magnitude of the minimal spin-polarized current that is required to reverse the magnetization direction in the free layer is given by $$I_{C0} = -\left(\frac{2e}{h}\right)\frac{\alpha M_S V}{g(\theta)p} H_{EFF} \quad (1)$$

where e is an electron charge, h is Plank constant, $\alpha$ is Gilbert's damping constant, $M_S$ is saturation magnetization of the free layer material, V is volume of the free layer, and p is a spin polarization of the current. The factor $g(\theta)$ depends on the relative angle $\theta$ between vectors of magnetization (shown by arrows in FIG. 4) in the pinned 12 an free 16 layers. The value of the factor $g(\theta)$ is minimal and close to zero when the vectors of the magnetizations in the free and pinned layers are parallel or anti parallel to each other ($\theta$ is equal to 0 or 180 degrees). The factor $g(\theta)$ has its maximum value when the vectors of magnetizations in the layers are perpendicular to each other (the angle $\theta$ is equal to 90 or 270 degrees). Effective magnetic field $H_{EFF}$ acting on the free layer depends on a direction of magnetization (in-plane or perpendicular) in the pinned and free layers. The effective field is given by the following equations for the in-plane and for perpendicular magnetic materials, respectively:

$$H_{EFF//} = H_{K//} + 2\pi M_S + H_{APP} + H_{DIP} \quad (2)$$

$$H_{EFF\perp} = H_{K\perp} - 4\pi M_S + H_{APP} + H_{DIP}, \quad (3)$$

where $H_{K//}$ and $H_{K\perp}$, is a field of uniaxial crystalline anisotropy of in-plane and perpendicular magnetic material, respectively; $H_{APP}$ and $H_{DIP}$ are applied external field and the dipole field from the pinned layer acting on the free layer. The factor $-4\pi M_S$ arises from the demagnetizing field of the thin film geometry of the free layer having the perpendicular anisotropy. The same factor for the free layer with in-plane anisotropy is equal to $+2\pi M_S$. Hence, the MTJ with perpendicular anisotropy may require substantially smaller (depends on $H_K$ and $M_S$) switching current than that with similar parameters but having the in-plane anisotropy.

The direction of the magnetization in the free layer 16 of the MR element in its equilibrium states can be parallel or anti-parallel to the magnetization direction in the pinned layer. At these conditions the switching current that is required to reverse the magnetization in the free layer has its maximum value. Moreover, the magnitude of the current depends significantly on the duration of a current pulse. The magnitude of the switching current is almost inverse proportional to the pulse duration. Hence, the high speed writing (short current pulse) requires high switching current. Magnitude of the switching current is limited by the probability of a tunnel barrier layer breakdown. The above obstacles limit switching speed and endurance of MRAM with spin-induced switching.

The equation (1) suggests that the spin-polarized write current can be reduced significantly by changing the angle $\theta$ between the vectors of the magnetization in the free and pinned layers. Since the orientation of magnetization in the pinned layer 12 is fixed, the angle $\theta$ can be changed by tilting the magnetization in the free layer 16 from its equilibrium state. Tilt of the magnetization of the free layer 16 can be provided by applying a bias magnetic field along a hard magnetic axis of the free layer 16.

FIG. 5 shows a schematic view of the memory cell comprising an MR element with perpendicular magnetization in the pinned 12 and free 16 magnetic layers along with adjacent bit BL and word WL lines. In addition to the spin-polarized switching current $I_S$ a bias current $I_B$ is further supplied to the bit line BL. The bias current $I_B$ running through the bit line BL produces a bias magnetic field $H_B$ (shown by arrow) that is applied along the hard axis of the free layer 16. To increase the bias magnetic field locally, in vicinity of the MR element to further reduce the required bias current $I_B$, the bit line BL comprises a conductive wire 52 and a magnetic flux concentrator (magnetic flux cladding) 54. The magnetic flux concentrator 54 is made of a soft magnetic material having a high permeability and a low coercivity such as NiFe. The flux concentrator 54 comprises a non-magnetic gap 56 formed on a side of the bit line BL facing the MR element. The free layer 16 is disposed adjacent to the non-magnetic gap 56 where the bias magnetic field $H_B$ has a maximum. Additional layers, such as a seed layer can be placed between the free layer 16 and the bit line BL. Insertion of the additional layer (or layers) between the free magnetic layer 16 and the bit line BL results in a reduction of the bias field. The magnetic field $H_B$ decreases almost inverse proportionally with a distance between the free layer 16 and the bit line surface containing the non-magnetic gap 56. FIG. 5 illustrates one exemplary implementation where a magnetic cladding is wrapped around a bit line that carries the bias current. Other magnetic flux cladding designs may also be used. The magnetic flux cladding can be used for a word line as well.

The bias magnetic field $H_B$ generated by the bias current $I_B$ is proportional to the current. For example, the current of 0.1 mA can generate a bias magnetic field of about 10 Oe in the vicinity of the MR element made with 65 nm technology node. The magnitude of the bias field $H_B$ is not sufficient to cause an unwanted reverse of the magnetization in the memory cells exposed to the bias field. The reversal of the magnetization can be achieved when both the bias magnetic field and spin-polarized current affect the MR element simultaneously. Hence the proposed hybrid writing mechanism provides a good selectivity of the memory cell in the array and significant reduction of the spin-polarized current $I_S$. That is important for achieving a high endurance of MRAM operating at high speed, especially.

Figure 6A:
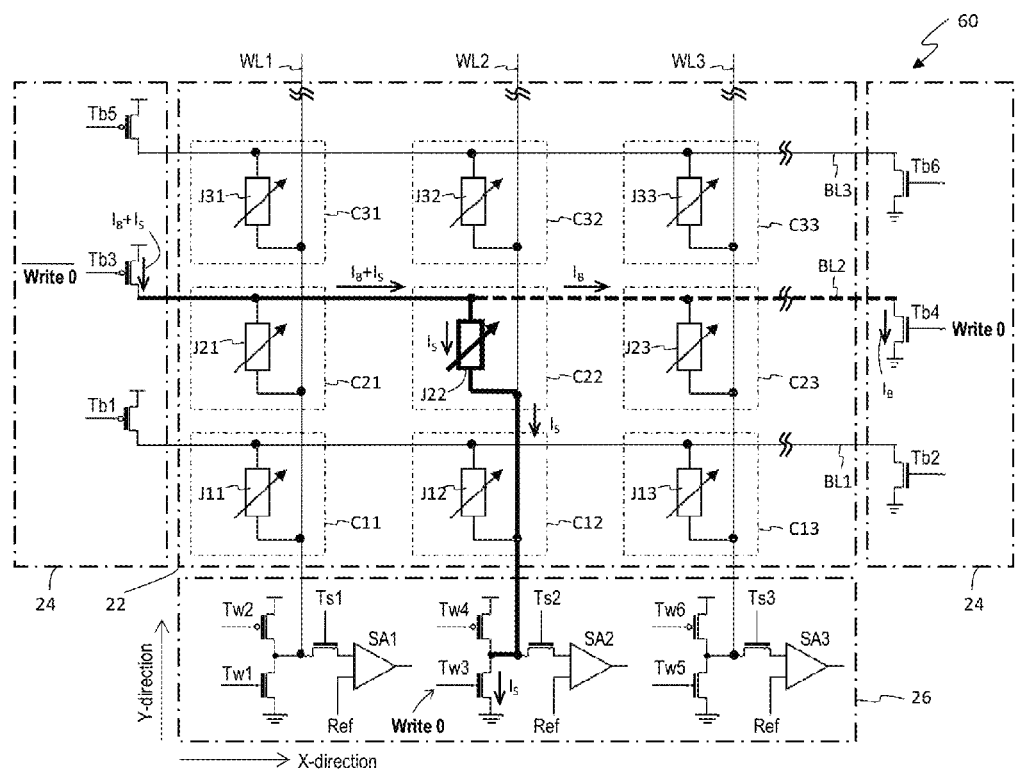
FIG. 6A is a circuit diagram of magnetic random access memory with hybrid switching mechanism illustrating writing a logic "0" to a memory cell according to another embodiment of the present disclosure.
Figure 6B:
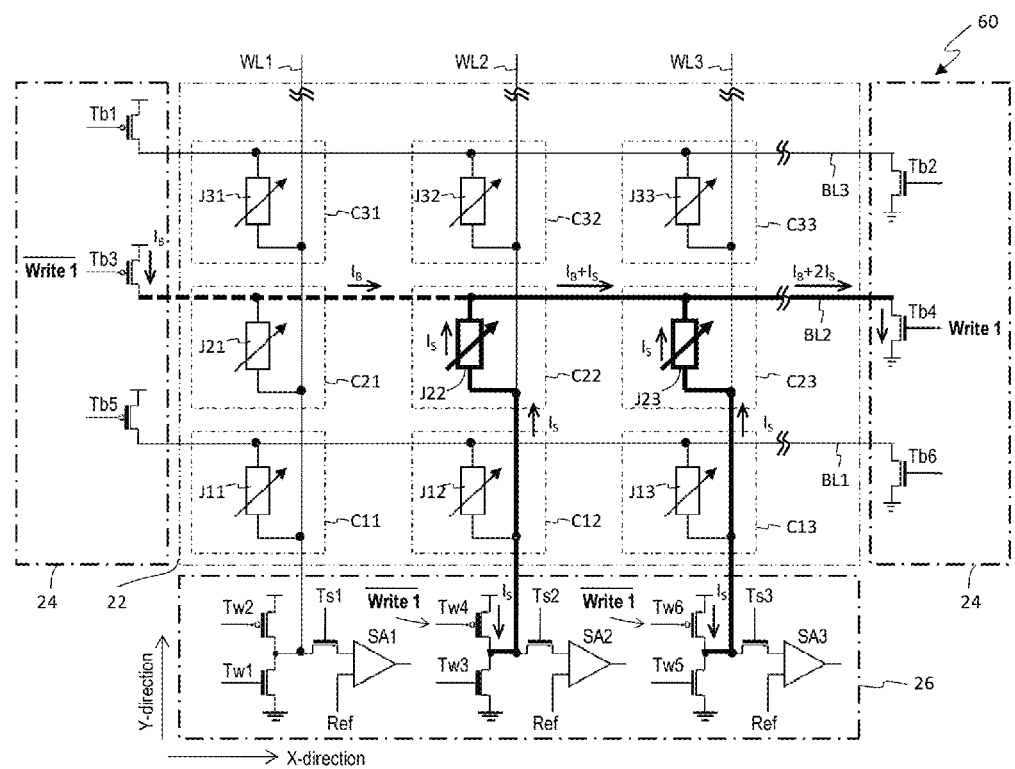
FIG. 6B is a circuit diagram of magnetic random access memory with hybrid switching mechanism illustrating writing logic "1" to several memory cells simultaneously according to another embodiment of the present disclosure.

FIGS. 6A and 6B show a circuit diagram of a portion of MRAM 60 employing a hybrid write mechanism. The memory 60 comprises two bit line drivers 24 connected to the opposite ends of the of the bit lines BL1-BL3. The word lines WL1-WL3 are connected at one end to the word line drivers 26.

To write a logic "0" to the MR element J22 (FIG. 6A) a bias current $I_B$ is supplied to the bit line BL2 by applying appropriate input signal to the gate of transistor Tb3 (Write0) and to the gate of the transistor Tb4 (Write 0). The bias current $I_B$ running through the bit line BL2 produces a bias magnetic field that is applied along the hard axis of the free layer. The bias field causes a tilt of the magnetization vector in the free layer from its equilibrium state that is perpendicular to the film surface. The magnitude and duration of the bias magnetic field can be controlled effectively by the input signal "Write0" and "Write 0" applied to the gate of the transistor Tb3 and Tb4. The bias current $I_B$ alone cannot cause a reversal of the magnetization in the MR element J22 and adjacent the bit line BL2 elements J21 and J23. Switching of the magnetization in the free layer is a joint effect of the bias magnetic field and a spin momentum transfer of polarized electrons of the current $I_S$ running through the MR element. To cause switching a spin-polarized current $I_S$ is supplied to the MR element J22. The current $I_S$ is running from the transistors Tb3 to the transistor Tw3 through the MR element J22 located at the intersection of the bit line BL2 and word line WL2 (shown in bold). Simultaneous effect of the bias magnetic field and spin-polarized current results in a logic state reversal of the MR element J22.

The input signals applied to the gate of the transistors Tb3, Tb4, and Tw4 should be synchronized in time. Pulses of the currents $I_B$ and $I_S$ can overlap each other partially (shifted in time) or completely. Order of the pulses at partial overlapping can be any. The transistor Tb4 should be opened while any of the transistors Tb3 or Tw4 are opened.

The memory 60 also provides a possibility of simultaneous writing to the several MR elements having electrical contact with the energized bit line BL2 (FIG. 6B). The bias current is supplied to the bit line BL2 by applying an appropriate input signal to the gate of the transistors Tb3 (Write1) and Tb4 (Write 1). The bias current $I_B$ produces a bias magnetic field along the entire line and tilts the direction of the magnetization in all MR elements adjacent to the bit line. This field is not sufficient to cause a reversal of the magnetization directions in the energized MR elements. To accomplish reversal a spin-polarized current needs to be applied to the element. FIG. 6B shows a circuit diagram of a portion of memory 60 during writing logic "1" to the memory cells C22 and C23 simultaneously when a bias current is applied to the line BL2. The appropriate input signals "Write1" are applied to the gate of the transistors Tw4 and Tw6 connected to the end of the word lines WL2 and WL3, respectively. The MR elements J22 and J23 located at the intersection of the word lines WL2 and WL3 with a bit line BL2 are experienced to cumulative effect of the bias magnetic field produced by the bas current $I_B$ and spin-polarized current $I_S$ running through the elements.

Data can be written to the memory cells C21, C22, C23 at the same time by applying an appropriate signal to the gate of the transistors Tw1 or Tw2, Tw3 or Tw4, Tw5 or Tw6. Simultaneous writing to several memory cells can provide significant reduction a write energy per bit by means of more effective use of bias current.

Transistors Tb1-Tb6 connected to the bit lines BL1-BL3 and the transistors Tw1-Tw6 connected word lines WL1-WL3 are experienced to different magnitudes of the current running through them during writing. Therefore they can have different saturation current that can be achieved by using different size of transistors or by using several transistors. For instance the transistors Tb1-Tb6 can have larger saturation current than the transistors Tw1-Tw6. The transistors Tw1-Tw6 control the switching spin-polarized current in the MR elements of the array 22.

Figure 7:
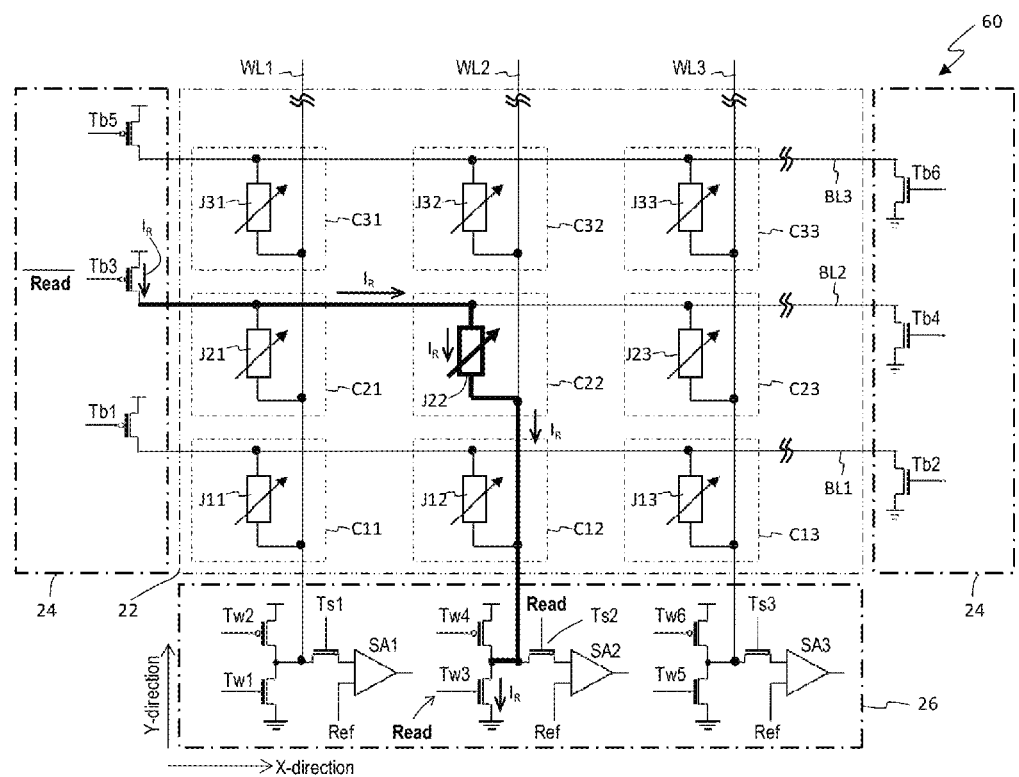
FIG. 7 is a circuit diagram of the magnetic random access memory shown in FIG. 6A during a read operation.

FIG. 7 shows a circuit diagram of the memory 60 according in read mode of operation. To read the data stored in the memory cell C22 an appropriate input signal needs to be applied to the transistors Tb3 (Read), Tw3 (Read), and Ts2 (Read). A signal produced by a read current $I_R$ running through the J22 represents a read signal that is proportional to a resistance of the MR element: high resistance for a logic "1" and a low voltage for the logic "0". The read current $I_R$ is smaller than the spin-polarized write current $I_S$ and cannot cause the reverse of the magnetization in the free layer of the J22 especially due to absence of the bias current $I_B$. The read signal is applied to one input of a sense amplifier SA2 through the opened transistor Ts2. A reference read signal Ref from a reference memory cell (not shown) is applied to another input of the sense amplifier SA2. An output of the amplifier SA2 provides an information about data stored in the memory cell C22.

The MR elements of the disclosed MRAMs can use magnetic materials with in-plane and/or perpendicular direction of the magnetization.

While the specification of this disclosure contains many specifics, these should not be construed as limitations on the scope of the disclosure or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above embodiments are intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

While the disclosure has been described in terms of several exemplary embodiments, those skilled in the art will recognize that the disclosure can be practiced with modification within the spirit and scope of the appended claims. Specifically, one of ordinary skill in the art will understand that the drawings herein are meant to be illustrative, and the spirit and scope of the disclosure are not limited to the embodiments and aspects disclosed herein but may be modified.

What is claimed is:

1. A method for writing to a magnetic memory comprising:
   providing a plurality of magnetic tunnel junctions disposed on a substrate and arranged into columns and rows, each magnetic tunnel junction comprising a free ferromagnetic layer having a reversible magnetization direction directed substantially perpendicular to the substrate in an equilibrium state, a pinned ferromagnetic layer having a fixed magnetization direction directed perpendicular to the substrate, and a tunnel barrier layer disposed between the free ferromagnetic layer and the pinned ferromagnetic layer;
   applying a first current to a first conductive line comprising a ferromagnetic cladding and being electrically coupled to a row of magnetic tunnel junctions at their ends adjacent to the free ferromagnetic layer to produce a bias magnetic field along a hard magnetic axis of the free ferromagnetic layer; and
   applying a second current to a second conductive line electrically coupled to a column of magnetic tunnel junctions at their ends adjacent to the pinned ferromagnetic layer to produce a spin momentum transfer in the free ferromagnetic layer of a first magnetic tunnel junction disposed at a first intersection region formed by the first conductive line and the second conductive line;
   wherein the first current and the second current are applied simultaneously;
   whereby a joint effect of the first current and the second current reverses the magnetization direction of the free ferromagnetic layer of the first magnetic tunnel junction.

2. The method of claim 1, wherein the ferromagnetic cladding further comprising a nonmagnetic gap disposed on a side of the first conductive line adjacent to the free ferromagnetic layer.

3. The method of claim 1, wherein the first conductive line is a part of a first plurality of parallel conductive lines which are separately electrically coupled to the rows of the plurality of magnetic tunnel junctions.

4. The method of claim 1, wherein the second conductive line is a part of a second plurality of parallel conductive lines which are separately electrically coupled to the columns of the plurality of magnetic tunnel junctions, and
   wherein the second plurality of conductive lines overlaps the first plurality of conductive lines at a plurality of intersection regions.

5. The method of claim 1, wherein each magnetic tunnel junction being located at an intersection region between one of the first plurality of parallel conductive lines and one of the second plurality of parallel conductive lines.

6. The method of claim 1, wherein the plurality of magnetic tunnel junctions is arranged into an array.

7. The method of claim 1, further comprising:
   applying a third current to a third conductive line electrically coupled to other column of the plurality of magnetic tunnel junctions at their ends adjacent to the pinned ferromagnetic layer to produce a spin momentum transfer in the free ferromagnetic layer of a second magnetic tunnel junction disposed at a second intersection region formed by the first conductive line and the third conductive line;
   wherein the first current, the second current, and the third current being applied simultaneously reverse the magnetization directions of the free ferromagnetic layer of the first magnetic tunnel junction and of the second magnetic tunnel junction.

8. The method of claim 7, wherein the third conductive line is a part of the second plurality of parallel conductive lines.

9. The method of claim 1 further comprising:
   providing a first circuitry electrically coupled to the first plurality of parallel conductive lines, and
   providing a second circuitry electrically coupled to the second plurality of parallel conductive lines.

10. The method of claim 9, wherein the first circuitry and the second circuitry are disposed along a perimeter of the array of the plurality of magnetic tunnel junctions.

\* \* \* \* \*